(12) United States Patent
Germann et al.

(10) Patent No.: US 10,992,261 B2
(45) Date of Patent: Apr. 27, 2021

(54) SEMICONDUCTOR INTEGRATED CIRCUITRY

(71) Applicant: SOCIONEXT INC., Yokohama (JP)

(72) Inventors: Bernd Hans Germann, Langen (DE); Vamshi Krishna Manthena, Langen (DE)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 16/244,010

(22) Filed: Jan. 9, 2019

(65) Prior Publication Data

US 2019/0229676 A1 Jul. 25, 2019

(30) Foreign Application Priority Data

Jan. 19, 2018 (EP) .................................... 18152590

(51) Int. Cl.
*H03B 5/12* (2006.01)
*H03C 3/09* (2006.01)
(Continued)

(52) U.S. Cl.
CPC ....... *H03B 5/1206* (2013.01); *H01L 23/5223* (2013.01); *H01L 23/5225* (2013.01);
(Continued)

(58) Field of Classification Search
CPC .. H03B 5/1206; H03B 5/1215; H03B 5/1228; H03B 5/1265; H03B 5/1243; H01L 23/5225; H01L 23/5226; H01L 23/5283; H01L 28/88; H01L 23/5384; H01L 23/5223; H01L 21/76816; H01L 21/76805; H01L 23/528; H01L 23/481; H01L 23/5227; H03L 7/16
(Continued)

(56) References Cited

U.S. PATENT DOCUMENTS 9,054,122 B2 6/2015 Maeda et al.
9,123,719 B2* 9/2015 Zhang ................. H01L 27/0805
(Continued)

FOREIGN PATENT DOCUMENTS

EP 2 680 308 A2 1/2014

OTHER PUBLICATIONS

Extended European Search Report of related European Patent Application No. 18152590.8, dated Jun. 28, 2018.

*Primary Examiner* — Richard Tan
(74) *Attorney, Agent, or Firm* — Arent Fox LLP

(57) ABSTRACT

In semiconductor integrated circuitry having metal layers and via layers sandwiched between adjacent said metal layers, a capacitor is formed from metal structures implemented in first to third metal layers. The metal structures comprise strips having widths parallel to the layers. The strips of the first layer form a first comb having a base strip and a plurality of finger strips extending from the base strip, the widths of the strips being in a lower range of widths. The strips of the second layer form a second comb having a base strip and a plurality of finger strips extending from the base strip, the widths of the finger strips being in the lower range of widths. The width of each base strip formed in the second layer is in an intermediate range of widths; and the strips formed in the third layer have widths in a higher range of widths.

12 Claims, 10 Drawing Sheets

(51) Int. Cl.
*H03L 7/099* (2006.01)
*H01L 23/522* (2006.01)
*H01L 23/528* (2006.01)
*H01L 23/538* (2006.01)
*H01L 49/02* (2006.01)
*H03L 7/16* (2006.01)

(52) U.S. Cl.
CPC ...... *H01L 23/5226* (2013.01); *H01L 23/5283* (2013.01); *H01L 23/5384* (2013.01); *H01L 28/88* (2013.01); *H03B 5/1215* (2013.01); *H03B 5/1228* (2013.01); *H03B 5/1243* (2013.01); *H03B 5/1265* (2013.01); *H03L 7/16* (2013.01)

(58) Field of Classification Search
USPC ............ 331/36 C, 117 R, 117 FE, 167
See application file for complete search history.

(56) References Cited

U.S. PATENT DOCUMENTS

| | | |
|---|---|---|
| 9,331,026 B1 | 5/2016 | Watt et al. |
| 2005/0121791 A1 | 6/2005 | Yamada et al. |
| 2012/0007214 A1 | 1/2012 | Chu et al. |
| 2016/0049393 A1 | 2/2016 | Jing et al. |
| 2017/0093362 A1 | 3/2017 | Jin et al. |
| 2017/0154951 A1 | 6/2017 | Cui et al. |

* cited by examiner

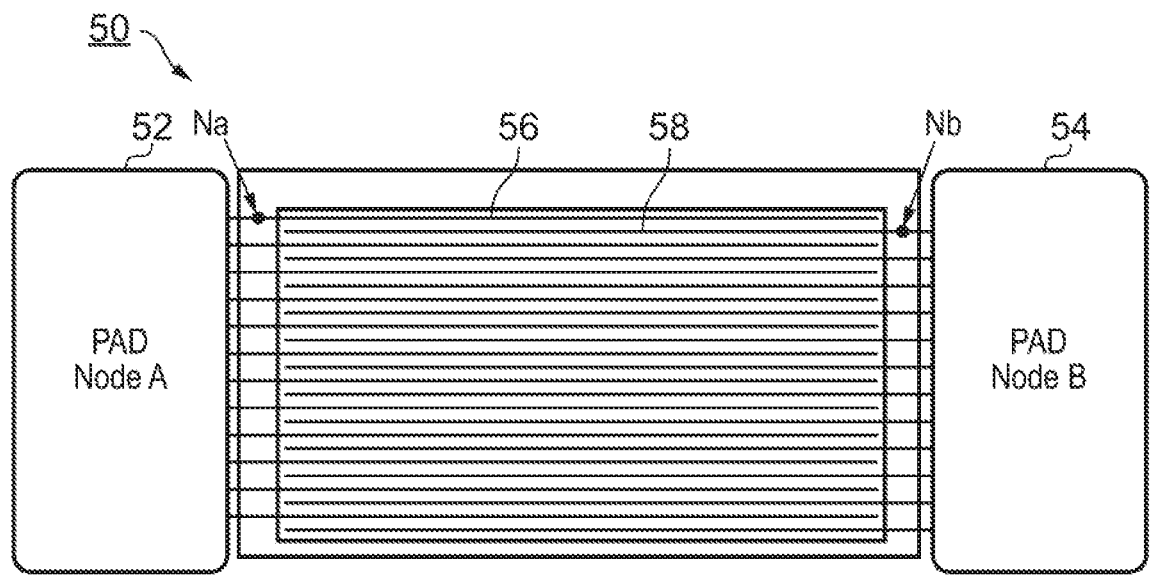
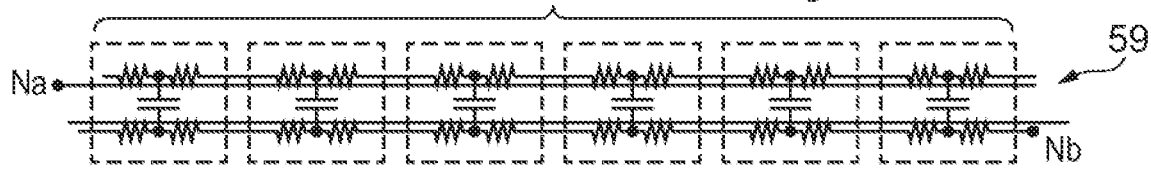
FIG. 2
BACKGROUND ART
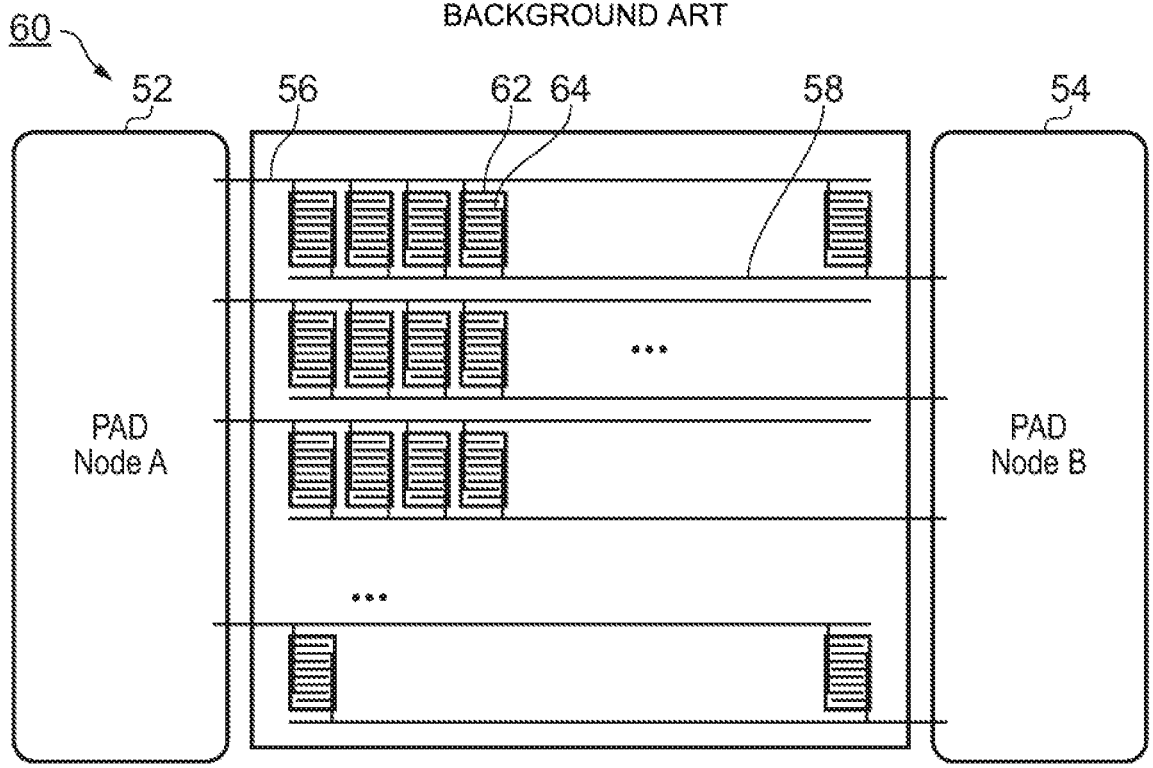
FIG. 3
BACKGROUND ART

US 10,992,261 B2

SEMICONDUCTOR INTEGRATED CIRCUITRY

CROSS-REFERENCE TO RELATED APPLICATION

This application claims priority from European Patent Application No. 18152590 filed Jan. 19, 2018 The entire contents of the prior application are incorporated herein by reference.

The present invention relates to semiconductor integrated circuitry, and in particular to such circuitry having a layered structure formed on a substrate, the layered structure comprising a plurality of metal layers and via layers sandwiched between adjacent metal layers.

Such semiconductor integrated circuitry may be provided in the form of an IC (integrated circuit) chip, and the IC chip may be provided as part of an IC package so that on-chip circuitry (implemented in the IC chip) can be connected with off-chip circuitry (implemented off the IC chip but connected thereto). In this context, the IC chip may be mounted on a package substrate of the IC package.

By way of context, FIGS. 1a and 1b show a schematic diagram of a previously-considered LC voltage-controlled oscillator (VCO) circuit 1 which may be implemented as semiconductor integrated circuitry, hereinafter simply an LC-VCO, i.e. whose function is based on inductive (L) and capacitive (C) components. The LC-VCO 1 is a CMOS LC-VCO and is shown specifically in FIG. 1(a). A portion of the LC-VCO 1 is shown in more detail in FIG. 1(b).

The LC-VCO 1 comprises a current source 2, a pair of cross-coupled transistors (PMOS MOSFETs) 4 and 6, a capacitor 8, an inductor 10, a pair of series-connected variable capacitors 12 and 14, a switched capacitor circuit 16, a pair of cross-coupled transistors (NMOS MOSFETs) 18 and 20, and a resistor 22.

The current source 2 is connected between a high voltage source (e.g. VDD) and a tail node 24, and the resistor 22 is connected between a low voltage source (e.g. GND or ground) and a tail node 26. First and second parallel current paths 28 and 30 are provided between the tail nodes 24 and 26.

The cross-coupled transistors 4 and 6 are provided on the first and second paths 28 and 30, respectively, with their source terminals connected to the tail node 24, and their gate terminals connected to each other's drain terminals. The cross-coupled transistors 18 and 20 are provided on the first and second paths 28 and 30, respectively, with their source terminals connected to the tail node 26, and their gate terminals connected to each other's drain terminals.

Intermediate nodes 32 and 34 are defined on the first and second paths 28 and 30, respectively. The intermediate node 32 is defined between the drain terminals of the transistors 4 and 18, and the intermediate node 34 is defined between the drain terminals of the transistors 6 and 20. The intermediate nodes 32 and 34 may serve as outputs of the LC-VCO 1.

The capacitor 8, inductor 10, pair of series-connected variable capacitors 12 and 14, and switched capacitor circuit 16 are connected in parallel between the intermediate nodes 32 and 34.

As shown in FIG. 1(b), the switched capacitor circuit 16 comprises a capacitor 36, a transistor (NMOS MOSFET) 38, a capacitor 40, an inverter (e.g. a CMOS inverter) 42 and resistors 44 and 46. The capacitor 36, transistor 38, and capacitor 40 are connected in series between the intermediate nodes 32 and 34, in that order. The gate terminal of the transistor 38 is connected to be controlled by a control signal CT (which may be a digital signal). The control signal CT is also provided via the inverter 42 and resistor 44 to an intermediate node 48 defined between the capacitor 36 and transistor 38, and via the inverter 42 and resistor 46 to an intermediate node 50 defined between the transistor 38 and capacitor 40.

In operation, the transistor 38 is turned on and off dependent on a selected code for the control signal CT, the different codes corresponding to different frequency bands. The variable capacitors (varactors) 12 and 14 are used to fine tune the frequency in that selected frequency band of interest.

The LC-VCO 1 requires capacitor 8 to have a high capacitance (i.e. big C), and also the switched capacitor circuit 16, for a wide tuning range as part of a tank circuit.

It has been considered that the capacitor 8 could be provided as an off-chip element (e.g. provided as a discrete component on a package substrate of an IC package) with the rest of the LC-VCO 1 being implemented as on-chip circuitry (implemented in an IC chip). However, such off-chip capacitors are relatively expensive and using such off-chip components is further undesirable since they constitute an unwanted design/area/integration overhead.

It has also been considered that the capacitor 8 could be provided on-chip along with the rest of the LC-VCO 1 (although the present inventors have considered providing the inductor 10 as an off-chip "packaged" inductor), for example implemented as a MOM (Metal-Oxide-Metal) capacitor with increased lengths made up of multiple unit MOM cells to provide the required high capacitance. Such MOM capacitors may be considered inter-digitated multi-finger capacitors formed by multiple metal layers in the layered structure of metal layers of the semiconductor integrated circuitry (i.e. IC chip), connected together as appropriate with vias in the via layers (inter-metal dielectrics) provided between the metal layers concerned. However, the LC-VCO 1 using such technology has also been found to be unsatisfactory.

It is desirable to address the above problems.

According to an embodiment of a first aspect of the present invention there is provided semiconductor integrated circuitry, having a layered structure formed on a substrate, the layered structure comprising a plurality of metal layers and via layers sandwiched between adjacent said metal layers, an upwards direction being defined through the layers away from the substrate, wherein: a capacitor is formed from metal structures implemented in at least first, second and third metal layers ordered in the upwards direction; the metal structures comprise arrangements of strips having widths parallel to the layers, the widths being within one of three ranges of widths, the ranges comprising a lower range of widths, an intermediate range of widths comprising widths larger than those in the lower range of widths, and a higher range of widths comprising widths larger than those in the intermediate range of widths; the strips formed in the first layer are organised into at least one first comb arrangement having a base strip and a plurality of finger strips extending from the base strip, the widths of the strips formed in the first layer being in the lower range of widths; the strips formed in the second layer are organised into at least one second comb arrangement having a base strip and a plurality of finger strips extending from the base strip, the widths of the finger strips formed in the second layer being in the lower range of widths, and the width of each base strip formed in the second layer being in the intermediate range of widths; and the strips formed in the third layer have widths in the higher range of widths.

The strips formed in the first layer are organised into a plurality of said first comb arrangements; and the strips formed in the second layer are organised into a plurality of said second comb arrangements.

The first comb arrangements may be arranged in an array. The second comb arrangements may be arranged in an array. Each said second comb arrangement may overly a corresponding said first comb arrangement.

Each said second comb arrangement may be connected to its corresponding first comb arrangement by vias having a relatively small cross-sectional area. The strips formed in the third layer may be connected to corresponding second comb arrangements by vias having a relatively large cross-sectional area, the cross-sectional areas extending parallel to the layers.

The third metal layer may be the uppermost metal layer of the metal layers. The third metal layer may be a routing layer, wherein the strips formed in the third metal layer are routings. The first, second and third metal layers may be consecutive metal layers of the metal layers. There may be plural said first, second and third metal layers.

The strips formed in the third metal layer may form extensions of terminals of the capacitor. The first and second comb arrangements may form distributed plates of the capacitor.

The capacitor may be a first capacitor. The metal layers may comprise adjacent lower metal layers and adjacent upper metal layers. The layers in which the first capacitor is formed may be upper metal layers, the structures forming the first capacitor being sized such that the first capacitor is a relatively high Q capacitor due to a relatively low resistance of those structures. A second capacitor may be formed from metal structures implemented in lower metal layers, which structures are sized such that the second capacitor is a relatively low Q capacitor due to a relatively high resistance of those structures.

The metal layers may comprise adjacent intermediate metal layers between the lower metal layers and the upper metal layers. The first and second capacitors may be formed in overlapping areas of the semiconductor integrated circuitry, the overlapping areas being parallel to the layers. A shield may be formed from metal structures implemented in one or more of the intermediate metal layers and may extend across at least part of the overlapping areas so as to shield the first capacitor.

At least one of said intermediate metal layers, below the one or more intermediate metal layers in which the shield is formed, may be devoid of circuit components or circuit tracks or metal strips across said at least part of the overlapping areas.

The first capacitor and the second capacitor may be circuit components of the same circuit implemented at least partly in the semiconductor integrated circuitry. The circuit may be an LC voltage-controlled oscillator circuit, the first capacitor may have a relatively high capacitance. The second capacitor may have a relatively low capacitance and be part of a switched capacitor array of the LC voltage-controlled oscillator circuit.

According to an embodiment of a second aspect of the present invention there is provided semiconductor integrated circuitry, having a layered structure formed on a substrate, the layered structure comprising a plurality of metal layers and via layers sandwiched between adjacent said metal layers, an upwards direction being defined through the layers away from the substrate, wherein: a capacitor having first and second terminals is formed from metal structures implemented in at least two of first, second and third metal layers ordered in the upwards direction, including the third metal layer; the metal structures comprise arrangements of strips having widths parallel to the layers; the strips in the third layer form extensions of the terminals of the capacitor; and the widths of the strips are ordered such that strips closer to the terminals are wider than strips further away from the terminals along the metal structures.

According to an embodiment of a third aspect of the present invention there is provided semiconductor integrated circuitry, having a layered structure formed on a substrate, the layered structure comprising a plurality of metal layers and via layers sandwiched between adjacent said metal layers, an upwards direction being defined through the layers away from the substrate, wherein: the metal layers comprise adjacent lower metal layers and adjacent upper metal layers; a first capacitor is formed from metal structures implemented in upper metal layers, which structures are sized such that the first capacitor is a relatively high Q capacitor due to a relatively low resistance of those structures; and a second capacitor is formed from metal structures implemented in lower metal layers, which structures are sized such that the second capacitor is a relatively low Q capacitor due to a relatively high resistance of those structures.

According to an embodiment of a fourth aspect of the present invention there is provided semiconductor integrated circuitry, having a layered structure formed on a substrate, the layered structure comprising a plurality of metal layers and via layers sandwiched between adjacent said metal layers, an upwards direction being defined through the layers away from the substrate, wherein: a capacitor having first and second terminals is formed from metal structures implemented in the metal layers, the capacitor being distributed across an area of the semiconductor integrated circuitry parallel to the layers; and the metal structures comprise: in the uppermost metal layer, being a routing layer, one or more routings extending across the area which serve as a first extension of the first terminal, and one or more routings extending across the area which serve as a second extension of the second terminal; in one or more metal layers under the uppermost metal layer, first networks of tracks which together form a distributed first plate of the capacitor, and second networks of tracks which together form a distributed second plate of the capacitor; and vias connecting the first networks of tracks to the first extension and the second networks of tracks to the second extension.

Reference will now be made, by way of example only, to the accompanying Figures, of which:

FIGS. 1a and 1b, discussed above, show a schematic diagram of a previously-considered LC voltage-controlled oscillator circuit;

FIG. 2 is a schematic diagram of a previously-considered on-chip MOM capacitor;

FIG. 3 is a schematic diagram of another previously-considered on-chip MOM capacitor;

Figure 1A:
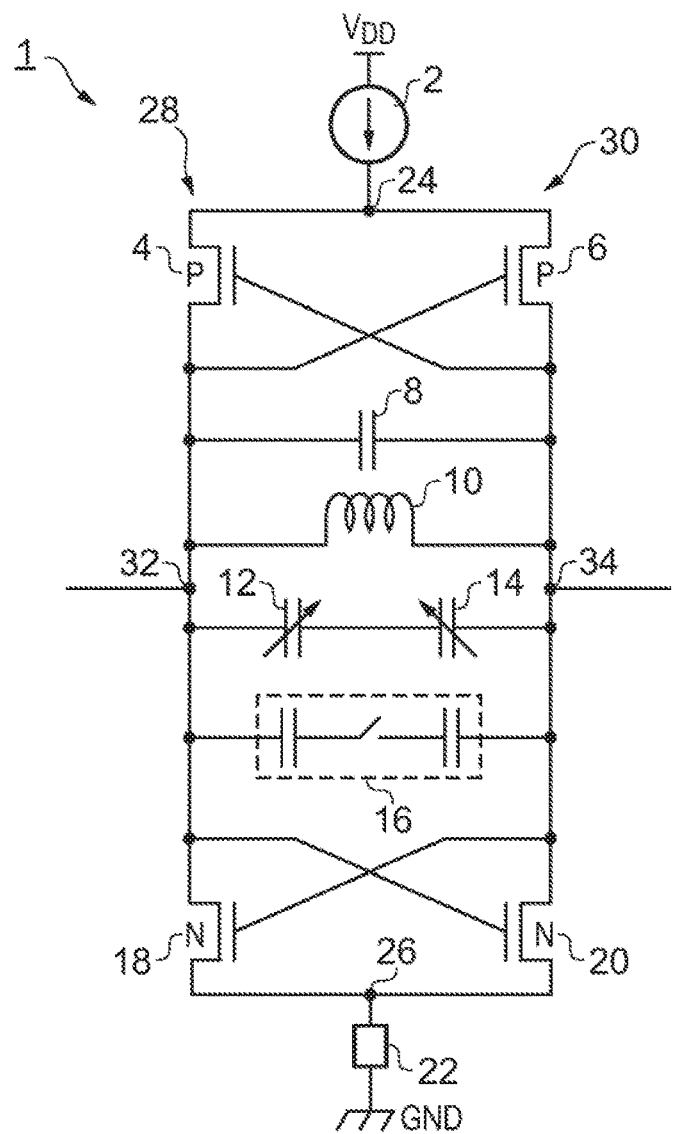

It has been considered that the previously-considered on-chip MOM capacitors do not have a significantly high enough Q (quality) factor, and that this degrades the performance of circuitry in which they are employed. The example of capacitor 8 in the LC-VCO 1 of FIGS. 1a and 1b will be taken forward as a convenient running example, since if that capacitor is sufficiently large it needs to have a very high Q factor for the performance of the LC-VCO 1 to be sufficient for certain high-accuracy applications.

Such previously-considered on-chip MOM capacitors unfortunately have a relatively high resistance (hence they do not have a high enough Q factor) attributable to the series connection of the distributed resistance of the overall MOM structure.

FIG. 2 is a schematic diagram of a previously-considered on-chip MOM capacitor 50 by way of example. Connection pads A 52 and B 54 effectively serve as terminals of the capacitor 50, and tracks 56 and 58 extending from these terminals serve as extensions of those terminals and also as distributed capacitor plates (where they run closely alongside one another). Representative nodes Na (for pad A 52) and Nb (for pad B 54) are indicated, for correspondence with the equivalent diagram 59 below. As indicated, the series resistance becomes relatively high based on this arrangement—the metal structures forming the tracks 56 and 58 have relatively small widths (and cross-sections) and thus relatively high resistance.

FIG. 3 is a schematic diagram of another previously-considered on-chip MOM capacitor 60 by way of example. Connection pads A 52 and B 54 again effectively serve as terminals of the capacitor 50, and tracks 56 and 58 extending from these terminals serve as extensions of those terminals. Repeating cells 64 of inter-digitated comb arrangements are connected to the tracks 56 and 58 as appropriate to serve as distributed capacitor plates (where the fingers 64 of the comb arrangements run closely alongside one another). Again, the metal structures forming the tracks 56 and 58 have relatively small widths (and cross-sections). The metal structures forming the repeating cells 64 have even smaller widths (and cross-sections). Thus the equivalent series resistance is higher than in FIG. 2. Further, since there is typically an area limitation in each direction (the MOM capacitor's size may be limited by a manufacturing rule), the series resistance becomes significantly larger. A larger number of unit capacitors connected together results in higher series resistance.

In order to address these issues, in overview, the present inventors have considered implementing an on-chip capacitor as a MOM capacitor (hereinafter high Q capacitor) having a particular structure (as described in more detail below) and also using the upper metal layers of the layered structure of the semiconductor integrated circuitry (IC chip), where the upwards direction is defined from the substrate through the metal layers. This enables the resistance associated with the high Q capacitor to be dramatically reduced and its Q factor to consequently be increased to a more satisfactory value.

Also, by implementing the high Q capacitor in the upper metal layers, it is possible to implement smaller (lower capacitance) capacitors (or other components) in the lower layers to make better use of the area of the integrated circuitry (e.g. chip) concerned. For example, looking at the LC-VCO 1 of FIGS. 1a and 1b, the capacitor 8 may correspond to the high Q capacitor and the capacitors 36 and 40 may correspond to such smaller capacitors.

Figure 4:
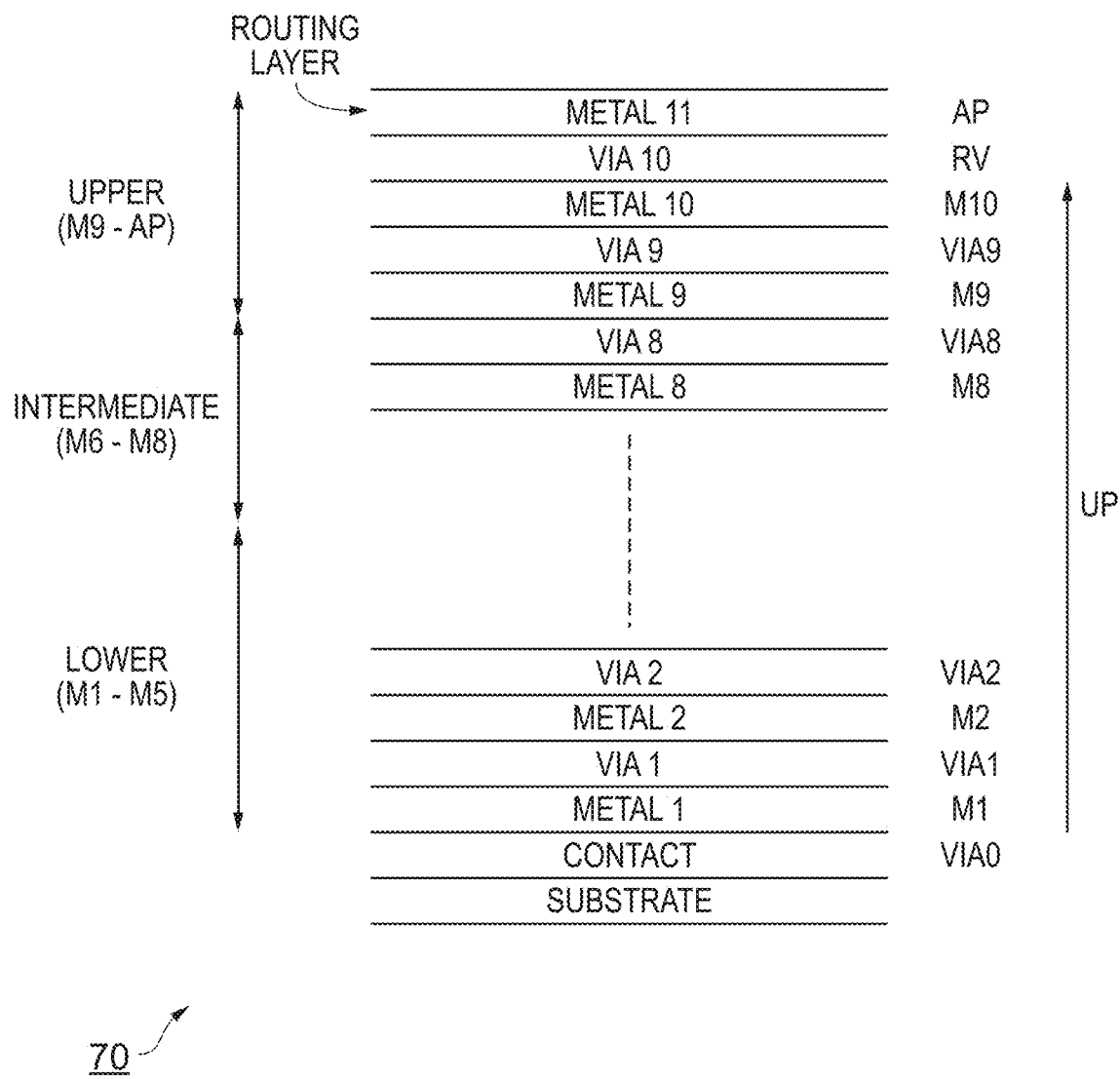
FIG. 4 is a schematic diagram of an example layer structure which may be adopted when implementing integrated circuits.

FIG. 4 is a schematic diagram of an example layer structure 70 which may be adopted when implementing integrated circuits (integrated circuitry, or semiconductor integrated circuitry) embodying the present invention. The particular number and labelling of the layers is of course just an example.

A substrate layer is provided at the bottom, followed by a contact layer (VIA0) and then alternating metal (e.g. M1) and via (e.g. VIA1) layers as indicated. An upwards direction is defined through the layers away from the substrate as shown.

The indications "AP" (for Metal 11) and "RV" (for Via 10) are simply labels corresponding to an example implementation. The label AP indicates that the top metal layer may be an aluminium layer (whereas the lower layers may be copper layers) and used for connection pads (hence AP) and the connections to them. The via layer (VIA10) adjacent to this "redistribution layer" (Metal 11) is labelled RV. The AP or Metal 11 layer will be referred to herein as a routing layer and connections made in this layer will be referred to as routings. Such a routing layer typically includes traces/routings interconnecting integrated circuit bond-pads to under-bump metallizations (not shown) formed on top of the routing layer, each for connection to a corresponding solder bump of the finished IC chip.

Signal lines may be implemented in the metal layers (e.g., in layers M8 and M9), with connections between the layers being made by vias implemented in the via layers or inter-metal dielectrics (e.g., in layer VIA8).

For convenience, the metal layers M1 to M5 will be referred as lower layers, the metal layers M6 to M8 will be referred as intermediate layers, and the metal layers M9 to AP will be referred as upper layers. The metal layers may get thinner in the downwards direction, with density and resistivity of structures/tracks also increasing in that direction.

Figure 5:
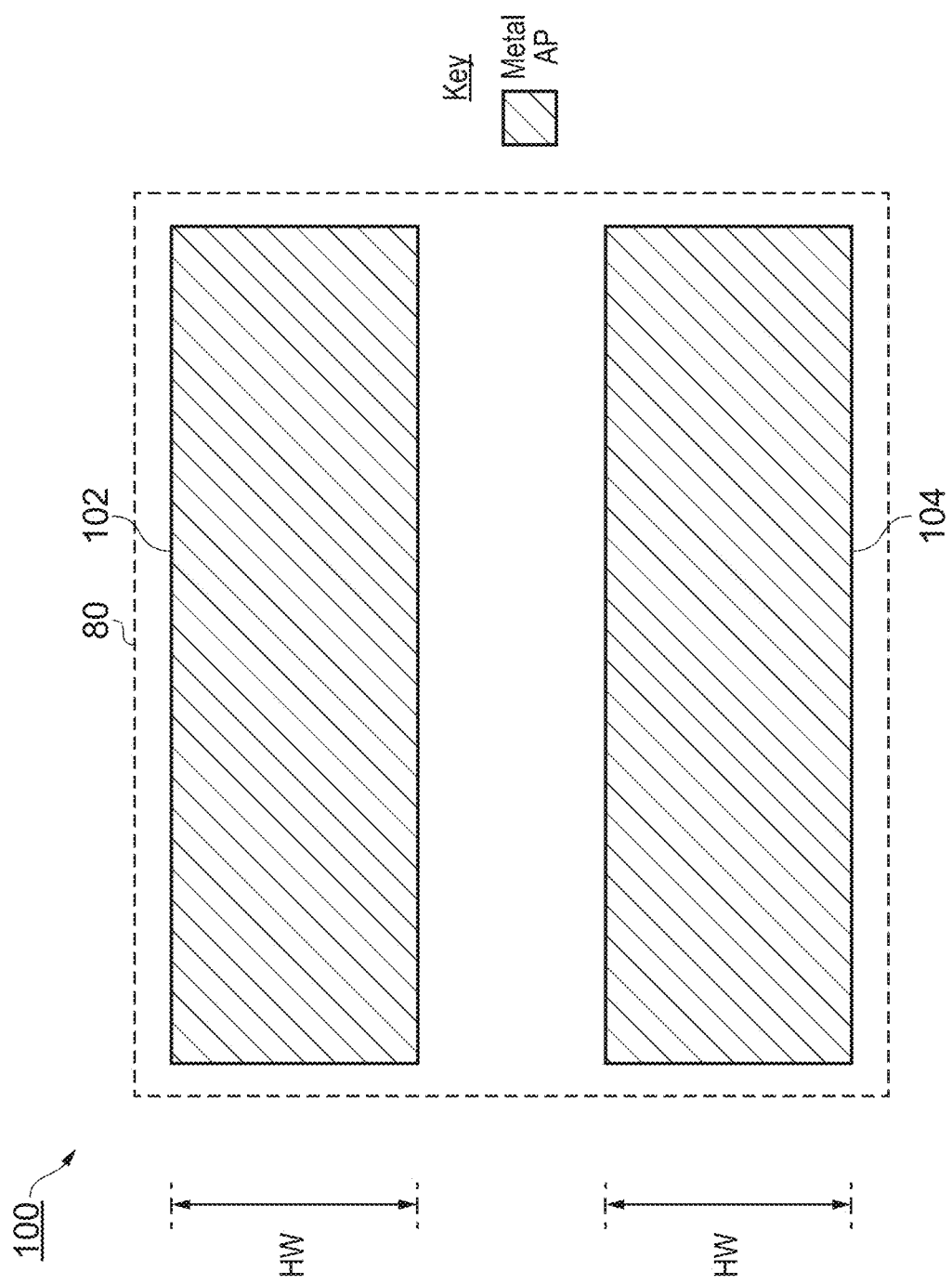
FIGS. 5 to 7 are schematic diagrams together presenting a representative part of a high Q capacitor embodying the present invention.
Figure 6:
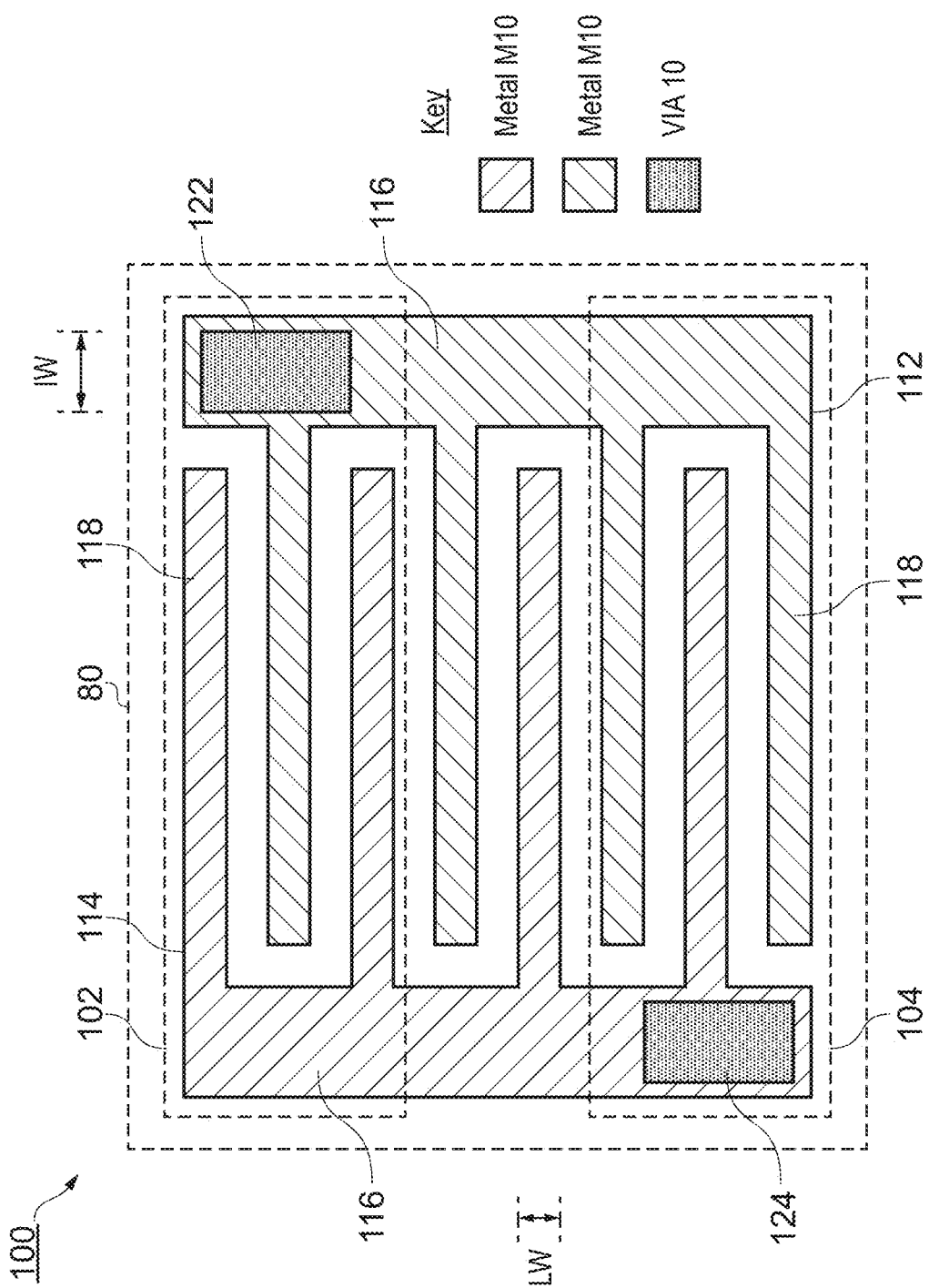
Figure 7:
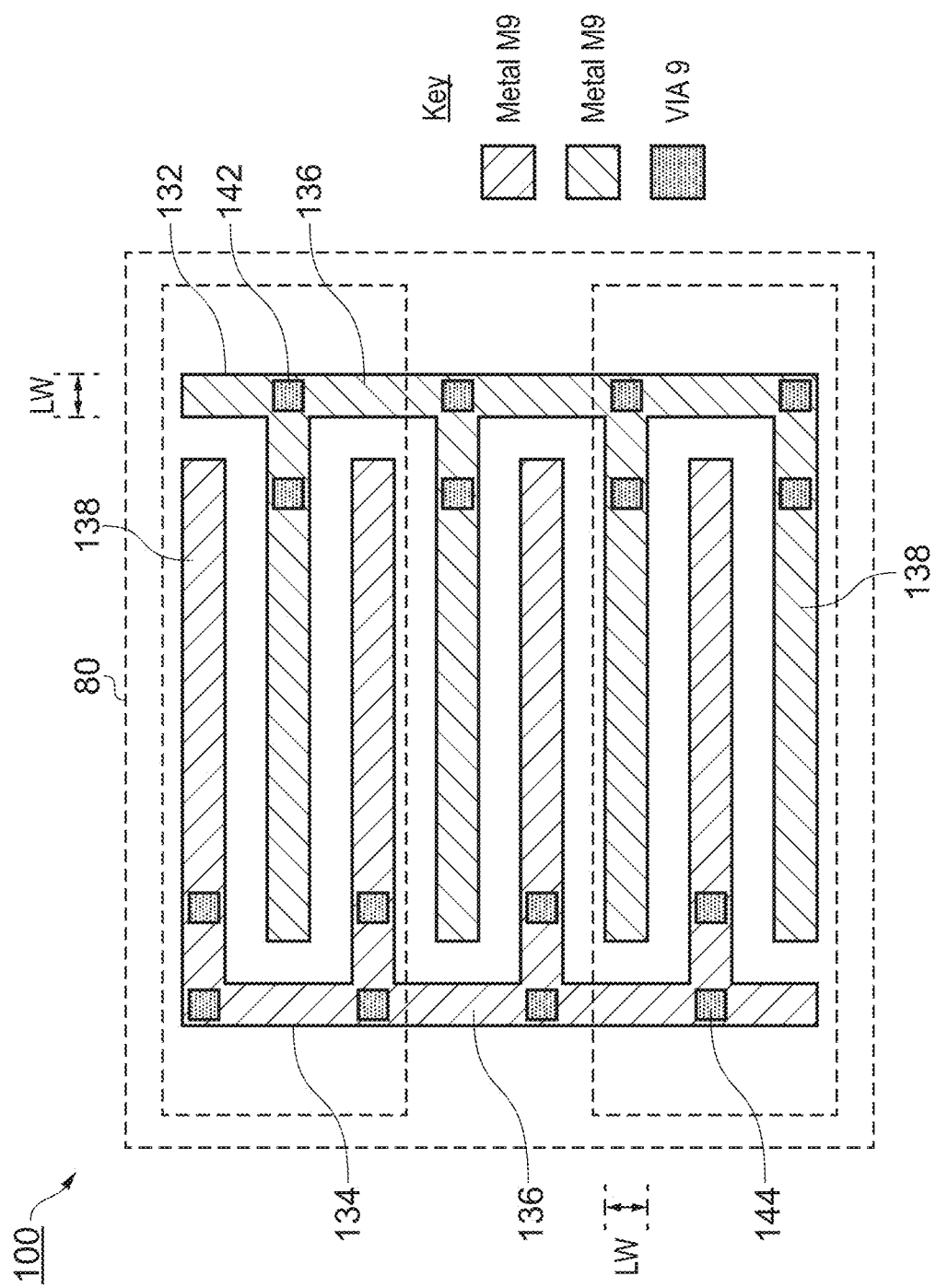

In overview, FIGS. 5 to 7 are schematic diagrams together presenting a representative part 80 of a high Q capacitor 100, formed from metal structures implemented in layers M9, M10 and AP (and via connections through the via layers therebetween). It is assumed in the present example that capacitor 100 is a big (high C) capacitor that may be used in place of capacitor 8 in FIGS. 1a and 1b. Of course, the representative part 80 may itself be considered a high Q capacitor albeit a smaller (lower capacitance) one. FIGS. 5 to 7 are plan views looking down through the layers of a particular area of an integrated circuit (e.g. an IC chip). It will become apparent that FIGS. 5 to 7 relate to different layers, and thus that they effectively may be considered to be stacked on top of one another.

FIG. 5 indicates metal structures or routings 102 and 104 formed in layer AP, corresponding to extensions of respective terminals of the capacitor 100. Thus, routings 102 and 104 are connected to capacitor terminals, nodes or bump pads corresponding to pads A 52 and B 54, respectively.

Routings 102 and 104 have widths HW (which may be, but need not be, the same as one another) which are within a higher range of widths (HW) of three ranges of widths. Here, the ranges comprise a lower range of widths (LW), an intermediate range of widths (IW) comprising widths larger than those in the lower range of widths (LW), and the higher range of widths (HW) comprising widths larger than those in the intermediate range of widths (IW).

Due to the large widths (in combination with the depths/thicknesses of the routings—not indicated), it is understood that routings 102 and 104 have very low resistances e.g. compared to the metal structures 56, 58, 62, 64 of FIGS. 2 and 3. The general idea is thus to use upper layer(s) such as layer AP for low resistance routings forming extensions of the capacitor nodes/terminals. The number of these AP (routing) layers is determined by how low a resistance is needed for a suitable Q value—here only a single such layer is shown for convenience and comparison with the example layer structure 70.

FIG. 6 indicates metal structures, in particular comb arrangements, 112 and 114 formed in layer M10. For convenience, the outline of routings 102 and 104 formed in layer AP is provided in dashed form to enable a comparison between FIGS. 5 and 6.

Comb arrangements 112 and 114 correspond in part to extensions of respective terminals of the capacitor 100. Thus, it may be considered that comb arrangements 112 and 114 are connected to capacitor terminals, nodes or bump pads corresponding to pads A 52 and B 54, respectively.

The comb arrangements 112 and 114 each have a base strip 116 and a plurality of finger strips 118 extending from the base strip 116. The finger strips 118 of the comb arrangements 112 and 114 are inter-digitated in an interlocking fashion (e.g. interleaved) as shown, so that each finger strip 118 is adjacent to at least a finger strip 118 of the other one of the comb arrangements 112 and 114. The inter-digitated finger strips 118 effectively serve as distributed plates of the capacitor 100.

The base strips 116 have widths IW (which may be, but need not be, the same as one another) which are within the intermediate range of widths (IW). The finger strips 118 have widths LW (which may be, but need not be, the same as one another) which are within the lower range of widths (LW). Nevertheless, these widths are larger than those of the metal structures 56, 58, 62, 64 of FIGS. 2 and 3. Therefore, the comb arrangements 112 and 114 have very low resistances as well. The general idea is thus to use one or more other upper layer(s) such as layer M10 for low resistance comb arrangements forming extensions of the capacitor nodes/terminals and also distributed capacitor plates. The number of these layers is determined by how low a resistance is need for a suitable Q value and the total C value needed for the capacitor—here only a single such layer is shown for convenience and comparison with the example layer structure 70.

Vias 122 and 124 are shown as present in via layer VIA10 connecting the comb arrangements 112 and 114 to the routings 102 and 104, respectively. These vias 122 and 124 may be considered to have relatively large cross-sectional areas (parallel to the plan view). Although they are shown as being rectangular in shape, they may be square in shape for example.

FIG. 7 indicates metal structures, in particular comb arrangements, 132 and 134 formed in metal layer M9. Again for convenience, the outline of routings 102 and 104 formed in layer AP is provided in dashed form to enable a comparison between FIGS. 5, 6 and 7.

Comb arrangements 132 and 134 correspond in part to extensions of respective terminals of the capacitor 100. Thus, comb arrangements 132 and 134 are connected to capacitor terminals, nodes or bump pads corresponding to pads A 52 and B 54, respectively.

The comb arrangements 132 and 134 each have a base strip 136 and a plurality of finger strips 138 extending from the base strip 136. The finger strips 138 of the comb arrangements 132 and 134 are also inter-digitated as shown, so that each finger strip 138 is adjacent to at least a finger strip 138 of the other one of the comb arrangements 132 and 134. The inter-digitated finger strips 138 also effectively serve as distributed plates of the capacitor 100. It will be appreciated that the finger strips 118 of FIG. 6 overly corresponding finger strips 138 of FIG. 7.

The base strips 136 and the finger strip 138 have widths LW (which may be, but need not be, the same as one another) which are within the lower range of widths (LW). Nevertheless, these widths are larger than those of the metal structures 56, 58, 62, 64 of FIGS. 2 and 3. Therefore, the comb arrangements 132 and 134 have very low resistances as well. The general idea is thus to use one or more other upper layer(s) such as layer M9 for low resistance comb arrangements forming extensions of the capacitor nodes/terminals and also distributed capacitor plates. The number of these layers is determined by how low a resistance is need for a suitable Q (quality) value and the total C (capacitance) value needed for the capacitor—here only a single such layer is shown for convenience and comparison with the example layer structure 70.

Vias 142 and 144 are shown as present in via layer VIA9 connecting the comb arrangements 132 and 134 to the comb arrangements 112 and 114, respectively. These vias 142 and 144 may be considered to have smaller cross-sectional areas than vias 122 and 124.

Figure 8:
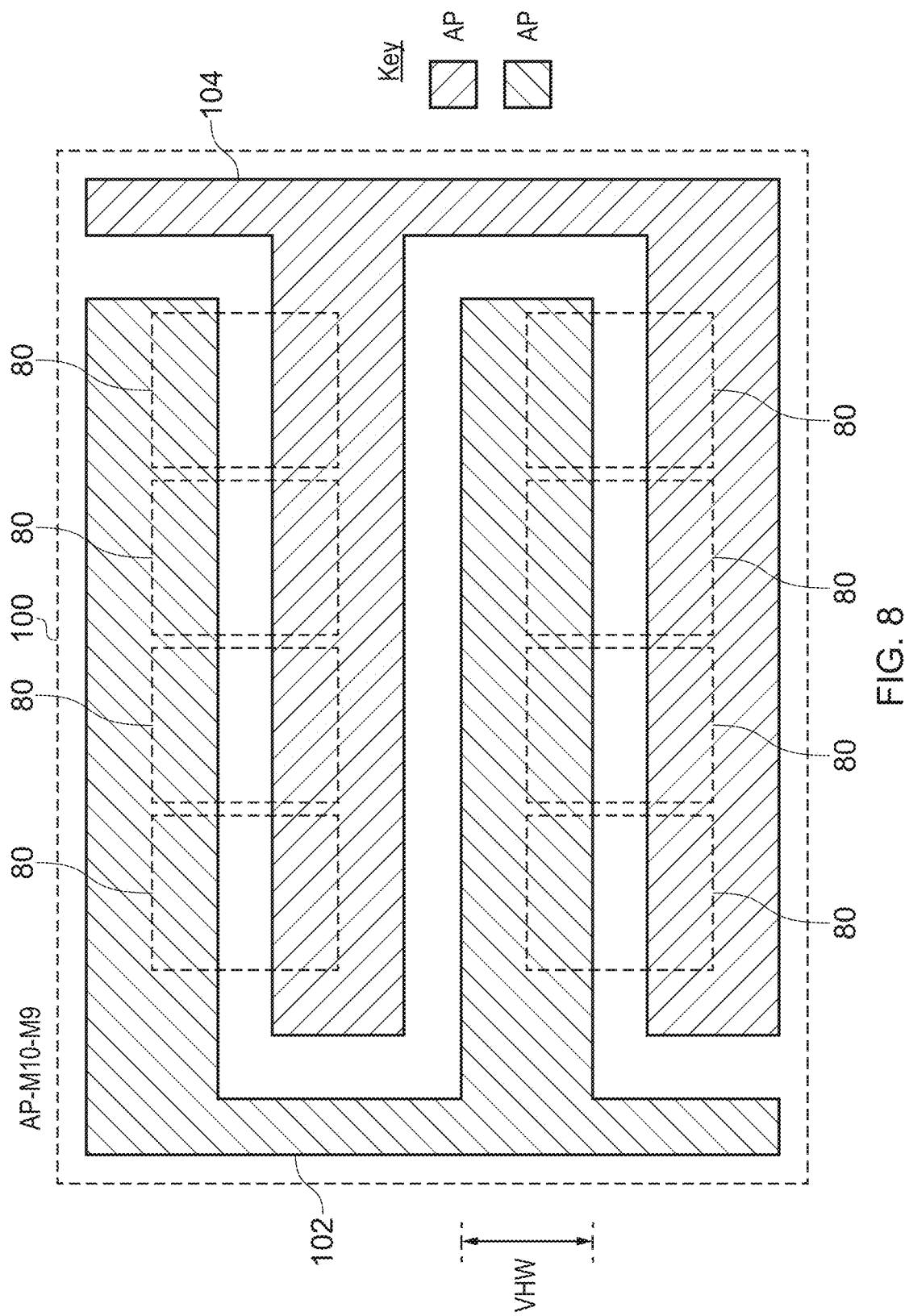
FIG. 8 is a schematic diagram of a high Q capacitor embodying the present invention.

Thus, FIGS. 5 to 7 together present the representative part 80 of the high Q capacitor 100. FIG. 8 is a schematic diagram indicating how the representative part 80 may be used multiple times (e.g. as repeating cells) to produce the high Q capacitor 100. The number of instances of representative part 80 in FIG. 8 is simply an example for ease of representation. There may for example be up to ten, or tens or hundreds of instances in an example implementation.

Although not indicated as such in FIGS. 5 to 7, it is clear from FIG. 8 that routings 102 and 104 formed in layer AP of FIG. 5 may be parts of a larger network of routings 102 and 104 whose widths (VHW) are very high. Indeed those routings 102 and 104 resemble comb arrangements. As indicated, the representative part 80 is provided multiple times in FIG. 8 as repeating cell, each time connecting into the same routings 102 and 104 so as to form the desired high C and high Q capacitor 100. Again, the routings 102 and 104 are connected to capacitor terminals, nodes or bump pads corresponding to pads A 52 and B 54, respectively.

The very high widths (VHW), which may be considered part of the higher range of widths (HW), help contribute to the very low resistances which lead to the high Q property of the capacitor 100. The multiple instances of the representative part 80 contribute the high C property.

Figure 9:
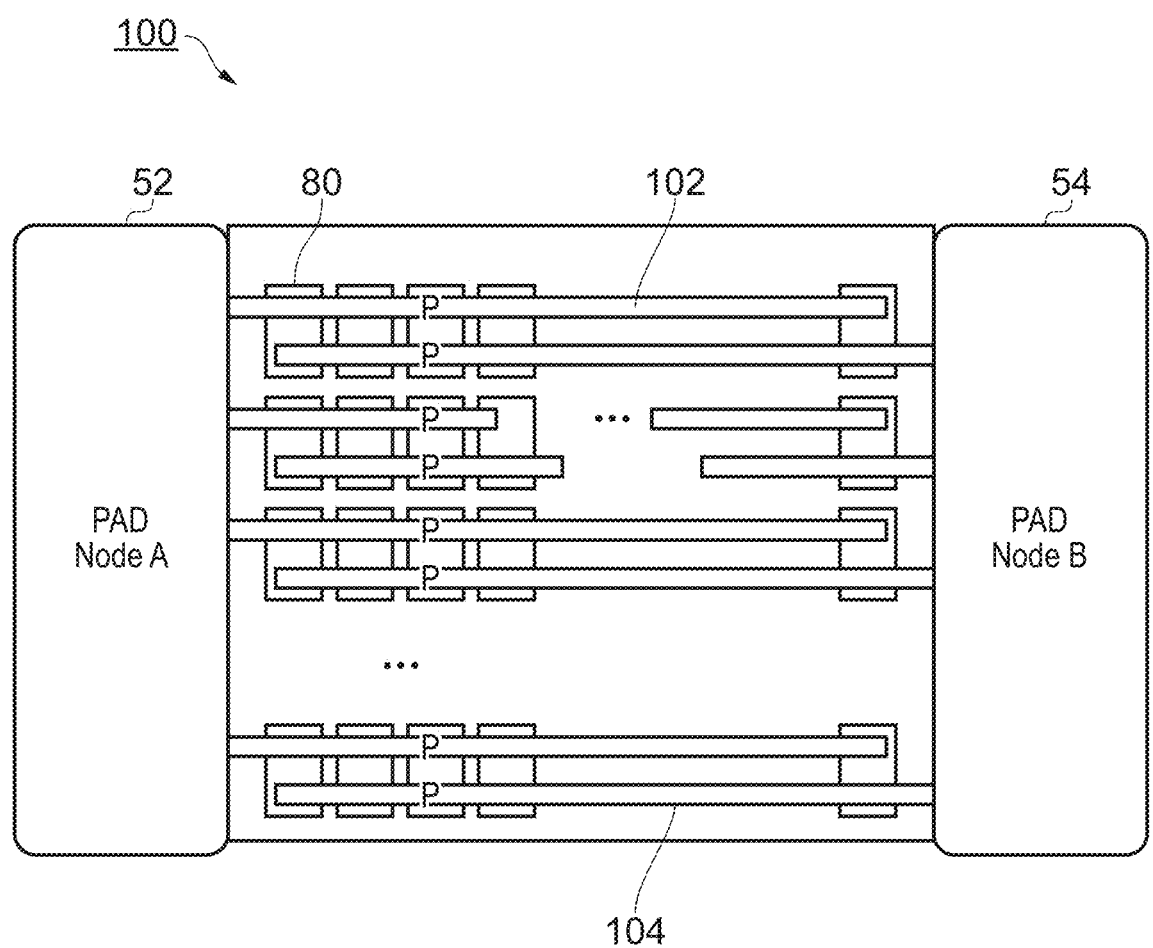
FIG. 9 is schematic diagram of a high Q capacitor embodying the present invention.

FIG. 9 is a schematic diagram of the capacitor 100, but presented in the style of FIGS. 2 and 3. Connection pads A 52 and B 54 serve as terminals of the capacitor 100, and routings 102 and 104 extending from these terminals serve as extensions of those terminals. The comb arrangement of routings shown in FIG. 8 is not reproduced in FIG. 9 for simplicity. Repeating cells corresponding to the representative part 80 are provided as indicated to arrive at the large MOM capacitor 100, with multiple MOM units 80 and top layer (AP) routings 102, 104 between bump pads 52 and 54.

Figure 1B:
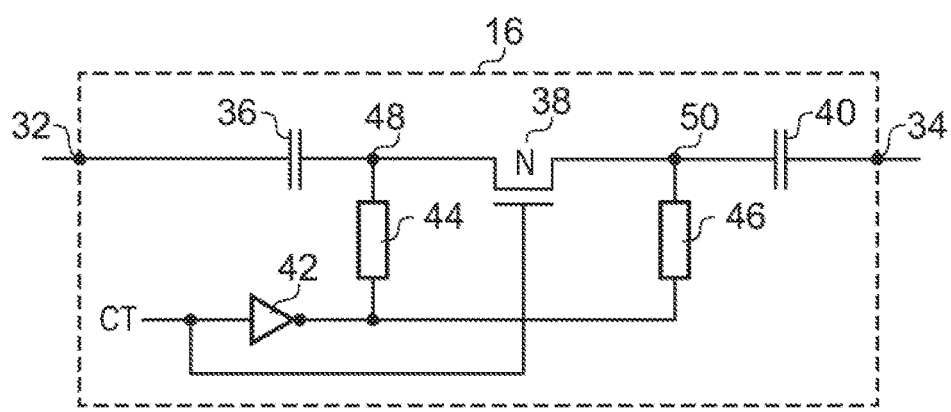

Although not shown in FIG. 9, in the context of implementing the LC-VCO 1 of FIGS. 1a and 1b using the capacitor 100 in place of capacitor 8, the bump pads 52 and 54 correspond to the intermediate nodes 32 and 34 of FIGS. 1a and 1b, respectively, and provide connection to the other circuit components as in FIGS. 1a and 1b (transistors, inductor, variable capacitors, switched capacitor circuit, resistor).

It will incidentally be appreciated that because the routings 102 and 104 run orthogonally to the base strips 116 in FIG. 6, the vias 122 and 124 need to be placed in areas where they can connect the relevant comb arrangement 112, 114 to the relevant routing 102, 104. Of course, the routings 102 and 104 could run parallel to the base strips 116 so as to enable placement of more vias 122, 124 on the base strips 116.

Figure 10:
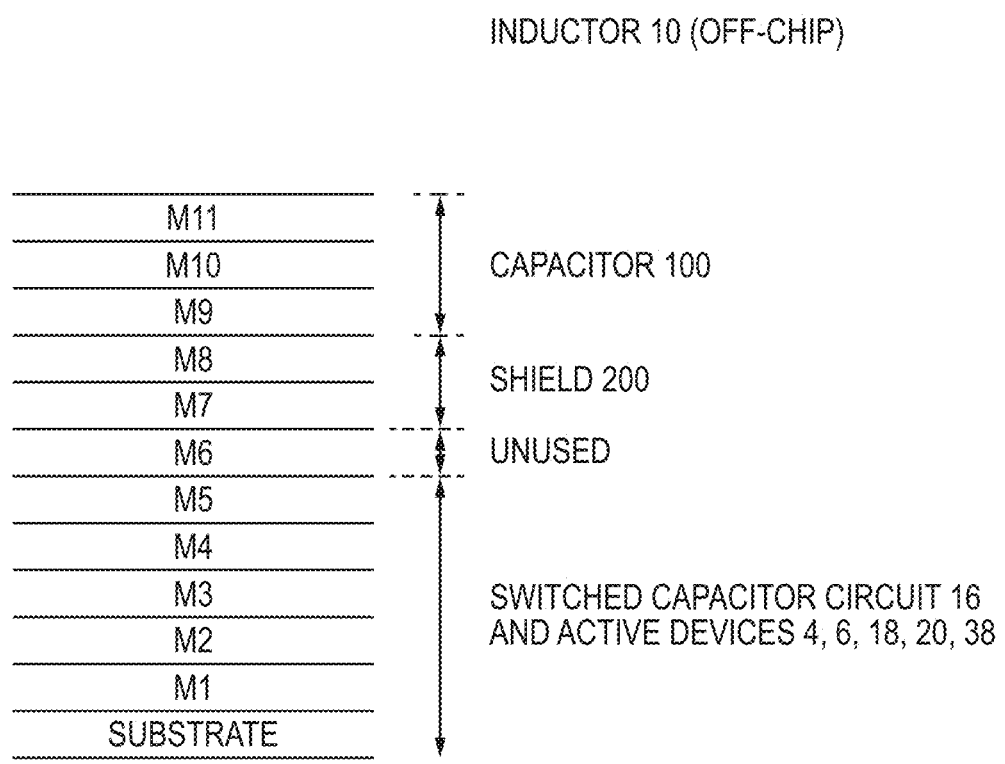
FIG. 10 is a schematic diagram useful for understanding an LC voltage-controlled oscillator circuit having the high Q capacitor of FIGS. 8 and 9.

FIG. 10 is a schematic diagram corresponding to the example layer structure 70, but with the via layers omitted for simplicity.

The purpose of FIG. 10 is to indicate that an advantage of implementing the capacitor 100 in the upper layers is that it becomes possible to implement LC-VCO 1 of FIGS. 1a and 1b (using the capacitor 100 in place of capacitor 8) in a stacked arrangement that is efficient in terms of chip area. That is, components of the LC-VCO 1 (using the capacitor 100 in place of capacitor 8) such as the switched capacitor circuit 16 and the active devices (transistors) 4, 6, 18, 20, 38 may be implemented in the lower layers and substrate as indicated. The inductor 10 may be a high Q inductor provided off-chip (as a "packaged" inductor), the other components of the LC-VCO 1 being on-chip.

The lower layers are thus used to build the switched capacitor array (switched capacitor circuit 16) to reduce the effective area of the LC-VCO 1 and further improve the loaded Q (as it is not necessary to run resistive connections across a larger area). As indicated in FIG. 10, it is further possible to introduce a (e.g. grounded) shield structure 200 (explained in more detail in connection with FIG. 11) in the intermediate layers. By doing so, the switched capacitor circuit 16 can be placed under the shield structure (or simply, shield) 200, thereby reducing the switched capacitor circuit 16 output routing distance. In this way, the overall loaded Q of the capacitor 100 in combination with the switched capacitor circuit 16 does not drop by much from the high Q value of the capacitor 100. This idea enables placement of the other devices of the LC-VCO 1 such as cross-coupled transistors 4, 6, 18, 20 and varactors 12, 14 close to the bump pads to improve the loaded Q of the LC tank.

As indicated in FIG. 10, in the present arrangement the M7 and M8 layers are used to implement the shield 200 while the M6 layer is left unused to reduce parasitic capacitance between the shield 200 and switched capacitor circuit 16. Layers M1 to M5 are used for the switched capacitor circuit (switched capacitor bank) 16 with the active elements (MOS transistors).

Figure 11:
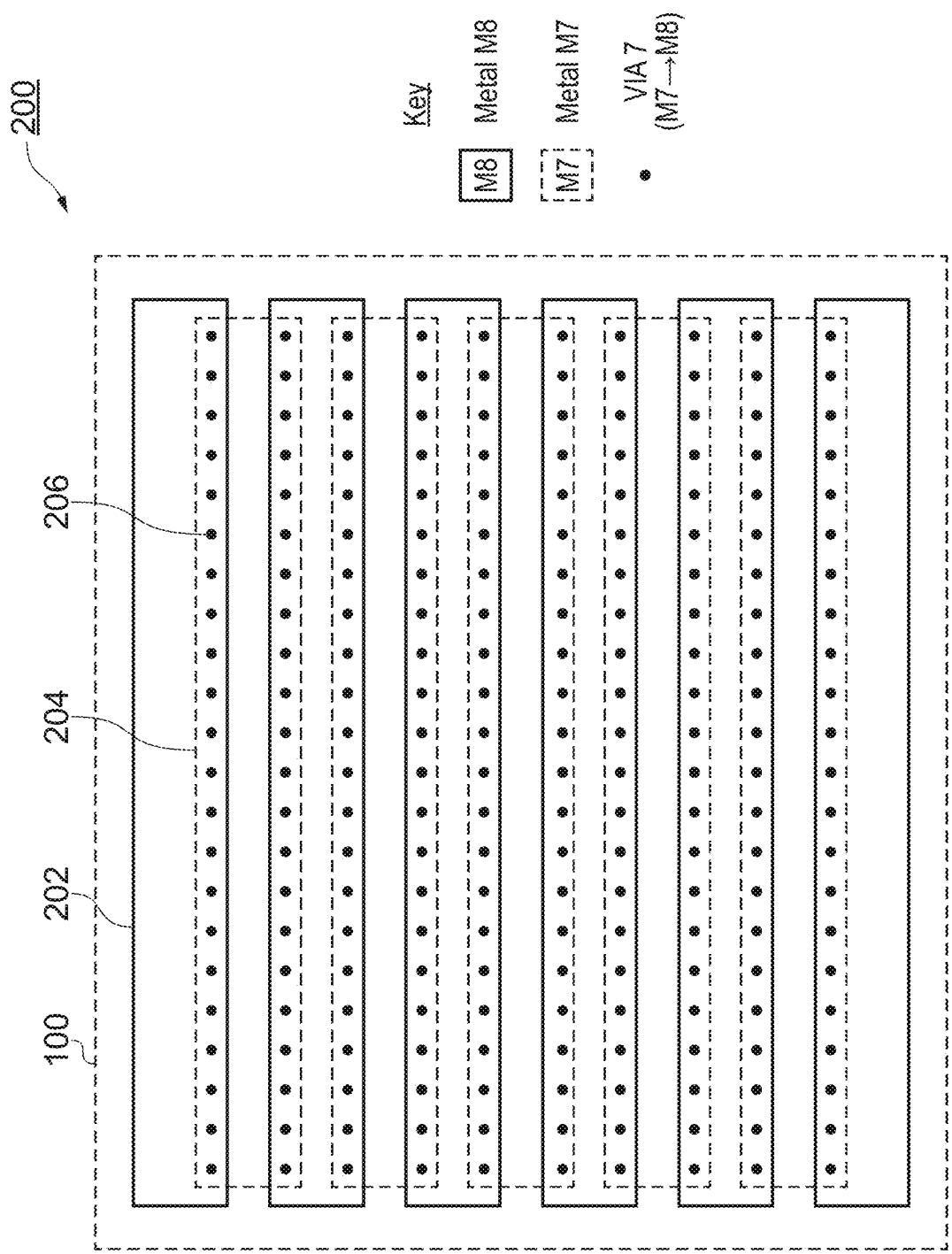
FIG. 11 is a schematic diagram of a shield formed in particular metal layers, for use in the LC voltage-controlled oscillator circuit of FIG. 10.

FIG. 11 is a schematic diagram of the shield 200 formed from metal structures implemented in layers M7 and M8. As indicated, the shield 200 comprises metal structures or strip 202 and 204 formed in the metal layers M8 and M7, respectively, and vias 206 connecting those strips 202, 204 together to form the overall shield structure. The strips 202 overlap partly with the strips 204 as shown so that the addition of the via connections 206 forms a single shield 200. The shield 200 may be connected to a voltage supply such as ground (not shown) so as to perform its shielding function.

The two-layer shield 200 (M7 and M8 with VIA7) allows complete shielding without a gap (due to the overlapping of strips 202, 204) and improves the Q of the MOM structure. Since there are active circuits (e.g. having transistors 4, 6, 18, 20) with lower-layer metal MOM capacitors (e.g. of switched capacitor circuit 16) below the shield 200, providing the shield 200 without gaps enables better noise isolation and helps to improve the Q factor.

The present invention may be embodied in many different ways in the light of the above disclosure, within the spirit and scope of the appended claims.

The present disclosure extends to the following numbered statements, which define embodiments of the present invention.

A

S1. Semiconductor integrated circuitry, having a layered structure formed on a substrate, the layered structure comprising a plurality of metal layers and via layers sandwiched between adjacent said metal layers, an upwards direction being defined through the layers away from the substrate, wherein:

a capacitor is formed from metal structures implemented in at least first, second and third metal layers ordered in the upwards direction;

the metal structures comprise arrangements of strips having widths parallel to the layers, the widths being within one of three ranges of widths, the ranges comprising a lower range of widths, an intermediate range of widths comprising widths larger than those in the lower range of widths, and a higher range of widths comprising widths larger than those in the intermediate range of widths;

the strips formed in the first layer are organised into at least one first comb arrangement having a base strip and a plurality of finger strips extending from the base strip, the widths of the strips formed in the first layer being in the lower range of widths;

the strips formed in the second layer are organised into at least one second comb arrangement having a base strip and a plurality of finger strips extending from the base strip, the widths of the finger strips formed in the second layer being in the lower range of widths, and the width of each base strip formed in the second layer being in the intermediate range of widths; and the strips formed in the third layer have widths in the higher range of widths.

S2. The semiconductor integrated circuitry according to statement S1, wherein;

the strips formed in the first layer are organised into a plurality of said first comb arrangements; and the strips formed in the second layer are organised into a plurality of said second comb arrangements.

S3. The semiconductor integrated circuitry according to statement S2, wherein;

the first comb arrangements are arranged in an array;

the second comb arrangements are arranged in an array; and each said second comb arrangement overlies a corresponding said first comb arrangement.

S4. The semiconductor integrated circuitry according to any of the preceding statements, wherein:

each said second comb arrangement is connected to its corresponding first comb arrangement by vias having a relatively small cross-sectional area; and the strips formed in the third layer are connected to corresponding second comb arrangements by vias having a relatively large cross-sectional area, the cross-sectional areas extending parallel to the layers.

S5. The semiconductor integrated circuitry according to any of the preceding statements, wherein the third metal layer is the uppermost metal layer of the metal layers.

S6. The semiconductor integrated circuitry according to any of the preceding statements, wherein the third metal layer is a routing layer, and wherein the strips formed in the third metal layer are routings.

S7. The semiconductor integrated circuitry according to any of the preceding statements, wherein the first, second and third metal layers are consecutive metal layers of the metal layers.

S8. The semiconductor integrated circuitry according to any of the preceding statements, wherein the strips formed in the third metal layer form extensions of terminals of the capacitor.

S9. The semiconductor integrated circuitry according to any of the preceding statements, wherein the first and second comb arrangements form distributed plates of the capacitor.

S10. The semiconductor integrated circuitry according to any of the preceding statements, wherein:
the capacitor is a first capacitor;
the metal layers comprise adjacent lower metal layers and adjacent upper metal layers;
the layers in which the first capacitor is formed are upper metal layers, the structures forming the first capacitor being sized such that the first capacitor is a relatively high Q capacitor due to a relatively low resistance of those structures; and
a second capacitor is formed from metal structures implemented in lower metal layers, which structures are sized such that the second capacitor is a relatively low Q capacitor due to a relatively high resistance of those structures.

S11. The semiconductor integrated circuitry according to statement S10, wherein:
the metal layers comprise adjacent intermediate metal layers between the lower metal layers and the upper metal layers;
the first and second capacitors are formed in overlapping areas of the semiconductor integrated circuitry, the overlapping areas being parallel to the layers; and
a shield is formed from metal structures implemented in one or more of the intermediate metal layers and extends across at least part of the overlapping areas so as to shield the first capacitor.

S12. The semiconductor integrated circuitry according to statement S11, wherein at least one of said intermediate metal layers, below the one or more intermediate metal layers in which the shield is formed, is devoid of circuit components or circuit tracks or metal strips across said at least part of the overlapping areas.

S13. The semiconductor integrated circuitry according to any of statements S10 to S12, wherein the first capacitor and the second capacitor are circuit components of the same circuit implemented at least partly in the semiconductor integrated circuitry.

S14. The semiconductor integrated circuitry according to statement S13, wherein:
the circuit is an LC voltage-controlled oscillator circuit;
the first capacitor has a relatively high capacitance; and
the second capacitor has a relatively low capacitance and is part of a switched capacitor array of the LC voltage-controlled oscillator circuit.

S15. Semiconductor integrated circuitry, having a layered structure formed on a substrate, the layered structure comprising a plurality of metal layers and via layers sandwiched between adjacent said metal layers, an upwards direction being defined through the layers away from the substrate, wherein:
a capacitor having first and second terminals is formed from metal structures implemented in at least two of first, second and third metal layers ordered in the upwards direction, including the third metal layer;
the metal structures comprise arrangements of strips having widths parallel to the layers;
the strips in the third layer form extensions of the terminals of the capacitor; and
the widths of the strips are ordered such that strips closer to the terminals are wider than strips further away from the terminals along the metal structures.

S16. The semiconductor integrated circuitry according to statement S15, wherein the sizes of vias connecting strips in one said metal layer to strips in another said metal layer are ordered such that vias closer to the terminals have a bigger size than vias further away from the terminals along the metal structures.

S17. The semiconductor integrated circuitry according to statement S15 or S16, wherein:
the metal structures forming the capacitor are implemented in the first, second and third metal layers;
the widths are within one of three ranges of widths, the ranges comprising a lower range of widths, an intermediate range of widths comprising widths larger than those in the lower range of widths, and a higher range of widths comprising widths larger than those in the intermediate range of widths;
the strips formed in the first layer are organised into at least one first comb arrangement having a base strip and a plurality of finger strips extending from the base strip, the widths of the strips formed in the first layer being in the lower range of widths;
the strips formed in the second layer are also organised into at least one second comb arrangement having a base strip and a plurality of finger strips extending from the base strip, the widths of the finger strips formed in the second layer being in the lower range of widths, and the width of each base strip formed in the second layer being in the intermediate range of widths; and
the strips formed in the third layer have widths in the higher range of widths.

S18. The semiconductor integrated circuitry according to statement S17, wherein;
the strips formed in the first layer are organised into a plurality of said first comb arrangements; and
the strips formed in the second layer are organised into a plurality of said second comb arrangements.

S19. The semiconductor integrated circuitry according to statement S18, wherein;
the first comb arrangements are arranged in an array; and
the second comb arrangements are arranged in an array; and
each said second comb arrangement overlies a corresponding said first comb arrangement.

S20. The semiconductor integrated circuitry according to any of statements S17 to S19, wherein:
each said second comb arrangement is connected to its corresponding first comb arrangement by vias having a relatively small cross-sectional area; and
the strips formed in the third layer are connected to corresponding second comb arrangements by vias having a relatively large cross-sectional area, the cross-sectional areas extending parallel to the layers.

S21. The semiconductor integrated circuitry according to any of statements S17 to S20, wherein the first and second comb arrangements form distributed plates of the capacitor.

S22. The semiconductor integrated circuitry according to any of statements S15 to S21, wherein the third metal layer is the uppermost metal layer of the metal layers.

S23. The semiconductor integrated circuitry according to any of statements S15 to S22, wherein the third metal layer is a routing layer, and wherein the strips formed in the third metal layer are routings.

S24. The semiconductor integrated circuitry according to any of statements S15 to S23, wherein the first, second and third metal layers are consecutive metal layers of the metal layers.

S25. The semiconductor integrated circuitry according to any of statements S15 to S24, wherein:
the capacitor is a first capacitor;
the metal layers comprise adjacent lower metal layers and adjacent upper metal layers;
the layers in which the first capacitor is formed are upper metal layers, the structures forming the first capacitor being sized such that the first capacitor is a relatively high Q capacitor due to a relatively low resistance of those structures; and
a second capacitor is formed from metal structures implemented in lower metal layers, which structures are sized such that the second capacitor is a relatively low Q capacitor due to a relatively high resistance of those structures.

S26. The semiconductor integrated circuitry according to statement S25, wherein:
the metal layers comprise adjacent intermediate metal layers between the lower metal layers and the upper metal layers;
the first and second capacitors are formed in overlapping areas of the semiconductor integrated circuitry, the overlapping areas being parallel to the layers; and
a shield is formed from metal structures implemented in one or more of the intermediate metal layers and extends across at least part of the overlapping areas so as to shield the first capacitor.

S27. The semiconductor integrated circuitry according to statement S26, wherein at least one of said intermediate metal layers, below the one or more intermediate metal layers in which the shield is formed, is devoid of circuit components or circuit tracks or metal strips across said at least part of the overlapping areas.

S28. The semiconductor integrated circuitry according to any of statements S25 to S27, wherein the first capacitor and the second capacitor are components of the same circuit implemented at least partly in the semiconductor integrated circuitry.

S29. The semiconductor integrated circuitry according to statement S28, wherein:
the circuit is an LC voltage-controlled oscillator circuit;
the first capacitor has a relatively high capacitance; and
the second capacitor has a relatively low capacitance and is part of a switched capacitor array of the LC voltage-controlled oscillator circuit.

B

S30. Semiconductor integrated circuitry, having a layered structure formed on a substrate, the layered structure comprising a plurality of metal layers and via layers sandwiched between adjacent said metal layers, an upwards direction being defined through the layers away from the substrate, wherein:
the metal layers comprise adjacent lower metal layers and adjacent upper metal layers;
a first capacitor is formed from metal structures implemented in upper metal layers, which structures are sized such that the first capacitor is a relatively high Q capacitor due to a relatively low resistance of those structures; and
a second capacitor is formed from metal structures implemented in lower metal layers, which structures are sized such that the second capacitor is a relatively low Q capacitor due to a relatively high resistance of those structures.

S31. The semiconductor integrated circuitry according to statement S30, wherein:
the metal layers comprise adjacent intermediate metal layers between the lower metal layers and the upper metal layers;
the first and second capacitors are formed in overlapping areas of the semiconductor integrated circuitry, the overlapping areas being parallel to the layers; and
a shield is formed from metal structures implemented in one or more of the intermediate metal layers and extends across at least part of the overlapping areas so as to shield the first capacitor.

S32. The semiconductor integrated circuitry according to statement S31, wherein at least one of said intermediate metal layers, below the one or more intermediate metal layers in which the shield is formed, is devoid of circuit components or circuit tracks or metal strips across said at least part of the overlapping areas.

S33. The semiconductor integrated circuitry according to any of statements S30 to S32, wherein the first capacitor and the second capacitor are components of the same circuit implemented at least partly in the semiconductor integrated circuitry.

S34. The semiconductor integrated circuitry according to any of statements S30 to S33, wherein:
the circuit is an LC voltage-controlled oscillator circuit;
the first capacitor has a relatively high capacitance; and
the second capacitor has a relatively low capacitance and is part of a switched capacitor array of the LC voltage-controlled oscillator circuit.

S35. The semiconductor integrated circuitry according to any of statements S30 to S34, wherein:
the first capacitor is formed from metal structures implemented in at least first, second and third metal layers of said upper layers ordered in the upwards direction;
the metal structures of the first capacitor comprise arrangements of strips having widths parallel to the layers, the widths being within one of three ranges of widths, the ranges comprising a lower range of widths, an intermediate range of widths comprising widths larger than those in the lower range of widths, and a higher range of widths comprising widths larger than those in the intermediate range of widths;
the strips formed in the first layer are organised into at least one first comb arrangement having a base strip and a plurality of finger strips extending from the base strip, the widths of the strips formed in the first layer being in the lower range of widths;
the strips formed in the second layer are also organised into at least one second comb arrangement having a base strip and a plurality of finger strips extending from the base strip, the widths of the finger strips formed in the second layer being in the lower range of widths, and the width of each base strip formed in the second layer being in the intermediate range of widths; and
the strips formed in the third layer have widths in the higher range of widths.

S36. The semiconductor integrated circuitry according to statement S35, wherein;
the strips formed in the first layer are organised into a plurality of said first comb arrangements; and
the strips formed in the second layer are organised into a plurality of said second comb arrangements.

S37. The semiconductor integrated circuitry according to statement S36, wherein;

the first comb arrangements are arranged in an array;
the second comb arrangements are arranged in an array; and
each said second comb arrangement overlies a corresponding said first comb arrangement.

S38. The semiconductor integrated circuitry according to any of statements S35 to S37, wherein:
each said second comb arrangement is connected to its corresponding first comb arrangement by vias having a relatively small cross-sectional area; and
the strips formed in the third layer are connected to corresponding second comb arrangements by vias having a relatively large cross-sectional area, the cross-sectional areas extending parallel to the layers.

S39. The semiconductor integrated circuitry according to any of statements S35 to S38, wherein the third metal layer is the uppermost metal layer of the metal layers.

S40. The semiconductor integrated circuitry according to any of statements S35 to S39, wherein the third metal layer is a routing layer, and wherein the strips formed in the third metal layer are routings.

S41. The semiconductor integrated circuitry according to any of statements S35 to S40, wherein the first, second and third metal layers are consecutive metal layers of the metal layers.

S42. The semiconductor integrated circuitry according to any of statements S35 to S41, wherein the strips formed in the third metal layer form extensions of terminals of the first capacitor.

S43. The semiconductor integrated circuitry according to any of statements S35 to S42, wherein the first and second comb arrangements form distributed plates of the first capacitor.

C

S44. Semiconductor integrated circuitry, having a layered structure formed on a substrate, the layered structure comprising a plurality of metal layers and via layers sandwiched between adjacent said metal layers, an upwards direction being defined through the layers away from the substrate, wherein:
a capacitor having first and second terminals is formed from metal structures implemented in the metal layers, the capacitor being distributed across an area of the semiconductor integrated circuitry parallel to the layers; and
the metal structures comprise:
in the uppermost metal layer, being a routing layer, one or more routings extending across the area which serve as a first extension of the first terminal, and one or more routings extending across the area which serve as a second extension of the second terminal;
in one or more metal layers under the uppermost metal layer, first networks of tracks which together form a distributed first plate of the capacitor, and second networks of tracks which together form a distributed second plate of the capacitor; and
vias connecting the first networks of tracks to the first extension and the second networks of tracks to the second extension.

S45. The semiconductor integrated circuitry according to statement S44, wherein:
the capacitor is formed from said metal structures implemented in at least first, second and third metal layers ordered in the upwards direction, the third layer being said uppermost layer;
the metal structures comprise arrangements of strips having widths parallel to the layers, the widths being within one of three ranges of widths, the ranges comprising a lower range of widths, an intermediate range of widths comprising widths larger than those in the lower range of widths, and a higher range of widths comprising widths larger than those in the intermediate range of widths;
the strips formed in the first layer are organised into at least one first comb arrangement having a base strip and a plurality of finger strips extending from the base strip, the widths of the strips formed in the first layer being in the lower range of widths;
the strips formed in the second layer are also organised into at least one second comb arrangement having a base strip and a plurality of finger strips extending from the base strip, the widths of the finger strips formed in the second layer being in the lower range of widths, and the width of each base strip formed in the second layer being in the intermediate range of widths; and
the strips formed in the third layer are said routings and have widths in the higher range of widths.

S46. The semiconductor integrated circuitry according to statement S45, wherein;
the strips formed in the first layer are organised into a plurality of said first comb arrangements; and
the strips formed in the second layer are organised into a plurality of said second comb arrangements.

S47. The semiconductor integrated circuitry according to statement S46, wherein;
the first comb arrangements are arranged in an array; and
the second comb arrangements are arranged in an array; and
each said second comb arrangement overlies a corresponding said first comb arrangement.

S48. The semiconductor integrated circuitry according to any of statements S45 to S47, wherein:
each said second comb arrangement is connected to its corresponding first comb arrangement by vias having a relatively small cross-sectional area; and
the strips formed in the third layer are connected to corresponding second comb arrangements by vias having a relatively large cross-sectional area, the cross-sectional areas extending parallel to the layers.

S49. The semiconductor integrated circuitry according to any of statements S45 to S48, wherein the first, second and third metal layers are consecutive metal layers of the metal layers.

S50. The semiconductor integrated circuitry according to any of statements S45 to S49, wherein pairs of said first and second comb arrangements form the distributed first plate of the capacitor, and other pairs of said first and second comb arrangements form the distributed second plate of the capacitor.

S51. The semiconductor integrated circuitry according to any of statements S44 to S50, wherein:
the capacitor is a first capacitor;
the metal layers comprise adjacent lower metal layers and adjacent upper metal layers;
the layers in which the first capacitor is formed are upper metal layers, the structures forming the first capacitor being sized such that the first capacitor is a relatively high Q capacitor due to a relatively low resistance of those structures; and
a second capacitor is formed from metal structures implemented in lower metal layers, which structures are sized such that the second capacitor is a relatively low Q capacitor due to a relatively high resistance of those structures.

S52. The semiconductor integrated circuitry according to statement S51, wherein:

the metal layers comprise adjacent intermediate metal layers between the lower metal layers and the upper metal layers;

the first and second capacitors are formed in overlapping areas of the semiconductor integrated circuitry, the overlapping areas being parallel to the layers; and a shield is formed from metal structures implemented in one or more of the intermediate metal layers and extends across at least part of the overlapping areas so as to shield the first capacitor.

S53 The semiconductor integrated circuitry according to statement S52, wherein at least one of said intermediate metal layers, below the one or more intermediate metal layers in which the shield is formed, is devoid of circuit components or circuit tracks or metal strips across said at least part of the overlapping areas.

S54. The semiconductor integrated circuitry according to any of statements S51 to S53, wherein the first capacitor and the second capacitor are components of the same circuit implemented at least partly in the semiconductor integrated circuitry.

S55. The semiconductor integrated circuitry according to statement S54, wherein:
the circuit is an LC voltage-controlled oscillator circuit;
the first capacitor has a relatively high capacitance; and
the second capacitor has a relatively low capacitance and is part of a switched capacitor array of the LC voltage-controlled oscillator circuit.

The invention claimed is:

1. Semiconductor integrated circuitry, having a layered structure formed on a substrate, the layered structure comprising a plurality of metal layers and via layers, comprising adjacent lower metal layers and adjacent upper metal layers, an upwards direction being defined through the layers away from the substrate,
wherein:
a first capacitor is formed from metal structures implemented in at least first, second and third layers of the upper metal layers which are provided at different positions in the upwards direction, respectively, and ordered in the upwards direction, the metal structures forming the first capacitor being sized such that the first capacitor is a relatively high Q capacitor due to a relatively low resistance of those structures;
the metal structures comprise arrangements of strips having widths parallel to the layers, the widths being within one of three ranges of widths, the ranges comprising a lower range of widths, an intermediate range of widths comprising widths larger than those in the lower range of widths, and a higher range of widths comprising widths larger than those in the intermediate range of widths;
first strips among the strips are formed in the first layer and are organised into at least one first comb arrangement having a base strip formed in the first layer and a plurality of finger strips formed in the first layer and extending from the base strip, said base strip and finger strips of the at least one first comb arrangement being strips among the first strips, the widths of the first strips being in the lower range of widths;
second strips among the strips are formed in the second layer and are organised into at least one second comb arrangement having a base strip formed in the second layer and a plurality of finger strips formed in the second layer and extending from the base strip, the widths of the finger strips of the second strips being in the lower range of widths, said base strip and finger strips of the at least one second comb arrangement being strips among the second strips, and the width of the base strip of the at least one second comb arrangement being in the intermediate range of widths;
the strips formed in the third layer have widths in the higher range of widths;
a second capacitor is formed from metal structures implemented in the lower metal layers, which metal structures are sized such that the second capacitor is a relatively low Q capacitor due to a relatively high resistance of those structures;
the plurality of metal layers comprise adjacent intermediate metal layers between the lower metal layers and the upper metal layers;
the first and second capacitors are formed in overlapping areas of the semiconductor integrated circuitry, the overlapping areas being parallel to the layers; and
a shield is formed from metal structures implemented in one or more of the intermediate metal layers connected to a ground voltage supply, wherein the shield extends across at least part of the overlapping areas so as to shield the first capacitor.

2. The semiconductor integrated circuitry as claimed in claim 1, wherein:
the strips formed in the first layer are organised into a plurality of said first comb arrangements; and
the strips formed in the second layer are organised into a plurality of said second comb arrangements.

3. The semiconductor integrated circuitry as claimed in claim 2, wherein:
the first comb arrangements are arranged in an array;
the second comb arrangements are arranged in an array; and
each said second comb arrangement overlies a corresponding said first comb arrangement.

4. The semiconductor integrated circuitry as claimed in claim 1, wherein:
each said second comb arrangement is connected to its corresponding first comb arrangement by vias having a relatively small cross-sectional area; and
the strips formed in the third layer are connected to corresponding second comb arrangements by vias having a relatively large cross-sectional area, the cross-sectional areas extending parallel to the layers.

5. The semiconductor integrated circuitry as claimed in claim 1, wherein the third metal layer is the uppermost metal layer of the upper metal layers.

6. The semiconductor integrated circuitry as claimed in claim 1, wherein the third metal layer is a routing layer, and wherein the strips formed in the third metal layer are routings.

7. The semiconductor integrated circuitry as claimed in claim 1, wherein the first, second and third metal layers are consecutive metal layers of the upper metal layers.

8. The semiconductor integrated circuitry as claimed in claim 1, wherein the strips formed in the third metal layer form extensions of terminals of the first capacitor.

9. The semiconductor integrated circuitry as claimed in claim 1, wherein the first and second comb arrangements form distributed plates of the first capacitor.

10. The semiconductor integrated circuitry as claimed in claim 1, wherein at least one of said intermediate metal layers, below the one or more intermediate metal layers in which the shield is formed, is devoid of circuit components or circuit tracks or metal strips across said at least part of the overlapping areas.

11. The semiconductor integrated circuitry as claimed in claim 1, wherein the first capacitor and the second capacitor are circuit components of a circuit implemented at least partly in the semiconductor integrated circuitry.

12. The semiconductor integrated circuitry as claimed in claim 11, wherein:
   the circuit is an LC voltage-controlled oscillator circuit;
   the first capacitor has a relatively high capacitance; and
   the second capacitor has a relatively low capacitance and is part of a switched capacitor array of the LC voltage-controlled oscillator circuit.

\* \* \* \* \*